United States Patent
Bus-Kwofie et al.

(10) Patent No.: US 6,878,240 B2
(45) Date of Patent: Apr. 12, 2005

(54) APPARATUS AND METHOD FOR OBTAINING SYMMETRICAL JUNCTIONS BETWEEN A READ SENSOR AND HARD BIAS LAYERS

(75) Inventors: Raymond Bus-Kwofie, Santa Clara, CA (US); James Mac Freitag, San Jose, CA (US); Serhat Metin, deceased, late of San Jose, CA (US); by Lichiao Metin, legal representative, San Jose, CA (US); Mustafa Pinarbasi, Morgan Hill, CA (US); Patrick Rush Webb, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/186,470

(22) Filed: Jun. 28, 2002

(65) Prior Publication Data

US 2004/0000477 A1 Jan. 1, 2004

(51) Int. Cl.⁷ .............................................. C23C 14/34
(52) U.S. Cl. ............................ 204/192.11; 204/298.04; 204/298.15; 427/131
(58) Field of Search ...................... 204/298.04, 298.12, 204/298.15, 192.12, 192.11, 192.34; 427/131

(56) References Cited

U.S. PATENT DOCUMENTS

| | | | |
|---|---|---|---|
| 4,234,797 A | 11/1980 | Ryding | 250/492 B |
| 4,628,209 A | 12/1986 | Wittkower | 250/492.2 |
| 4,733,091 A | 3/1988 | Robinson et al. | 250/492.2 |
| 4,781,520 A | 11/1988 | Balter | 414/751 |
| 4,831,270 A | 5/1989 | Weisenberger | 250/492.2 |
| 4,891,526 A | 1/1990 | Reeds | 250/442.1 |
| 4,980,562 A | 12/1990 | Berrian et al. | 250/492.2 |
| 5,308,461 A | 5/1994 | Ahonen | 204/192.11 |
| 5,389,793 A | 2/1995 | Aitken et al. | 250/492.21 |
| 6,025,602 A | 2/2000 | Rose et al. | 250/492.21 |
| 6,086,727 A | 7/2000 | Pinarbasi | 204/192.11 |
| 6,226,158 B1 * | 5/2001 | Pinarbasi | 360/322 |
| 6,267,851 B1 * | 7/2001 | Hosokawa | 204/192.12 |

* cited by examiner

*Primary Examiner*—Steven Versteeg
(74) *Attorney, Agent, or Firm*—Ervin F. Johnston

(57) ABSTRACT

A sputtering system is provided with a substrate and a sputtering material layer that are located in a sputtering chamber. The sputtering material layer has a sputtering surface where atoms of the material are sputtered and the substrate has a forming surface with a site where atoms of the sputtered material are to be formed. The sputtering material layer has a sputtering center which is located at a center of the atoms to be sputtered and the aforementioned site has a periphery with a forming center at a center of the periphery. The sputtering center is offset from the forming center so that shadowing at outer extremities of photoresist masks near the periphery of the substrate is minimized.

26 Claims, 14 Drawing Sheets

(ABS)

APPARATUS AND METHOD FOR OBTAINING SYMMETRICAL JUNCTIONS BETWEEN A READ SENSOR AND HARD BIAS LAYERS

BACKGROUND OF THE INVENTION

1. Field of the Invention

The present invention relates to an apparatus and method for obtaining symmetrical junctions between a read sensor and hard bias layers and, more particularly, to an ion beam sputtering system which makes hard bias layers on each side of a read sensor substantially the same size even though they are located near an outside periphery of a wafer substrate during fabrication.

2. Description of the Related Art

The heart of a computer is a magnetic disk drive which includes a rotating magnetic disk, a slider that has write and read heads, a suspension arm above the rotating disk and an actuator arm. The suspension arm biases the slider into contact with the surface of the disk when the disk is not rotating but, when the disk rotates, air is swirled by the rotating disk adjacent an air bearing surface (ABS) of the slider causing the slider to ride on an air bearing a slight distance from the surface of the rotating disk. When the slider rides on the air bearing the actuator arm swings the suspension arm to place the write and read heads over selected circular tracks on the rotating disk where field signals are written and read by the write and read heads. The write and read heads are connected to processing circuitry that operates according to a computer program to implement the writing and reading functions.

An exemplary high performance read head employs a spin valve sensor for sensing the magnetic signal fields from the rotating magnetic disk. The sensor includes a nonmagnetic electrically conductive spacer layer sandwiched between a ferromagnetic pinned layer and a ferromagnetic free layer. An antiferromagnetic pinning layer interfaces the pinned layer for pinning the magnetic moment of the pinned layer 90° to an air bearing surface (ABS) wherein the ABS is an exposed surface of the sensor that faces the rotating disk. First and second leads are connected to the spin valve sensor for conducting a sense current therethrough. A magnetic moment of the free layer is free to rotate upwardly and downwardly with respect to the ABS from a quiescent or zero bias point position in response to positive and negative magnetic signal fields from the rotating magnetic disk. The quiescent position of the magnetic moment of the free layer, which is preferably parallel to the ABS, is when the sense current is conducted through the sensor without magnetic field signals from the rotating magnetic disk.

When a sense current is conducted through the spin valve sensor, resistance changes cause potential changes that are detected and processed as playback signals. The sensitivity of the spin valve sensor is quantified as magnetoresistance or magnetoresistive coefficient dr/R where dr is the change in resistance of the spin valve sensor from minimum resistance (magnetic moments of free and pinned layers parallel) to maximum resistance (magnetic moments of the free and pinned layers antiparallel) and R is the resistance of the spin valve sensor at minimum resistance. Because of the high magnetoresistance of a spin valve sensor it is sometimes referred to as a giant magnetoresistive (GMR) sensor.

First and second hard bias layers and first and second lead layers are connected to first and second side surfaces of the sensor, which connection is known in the art as a contiguous junction. This junction is described in commonly assigned U.S. Pat. No. 5,018,037 which is incorporated by reference herein. The first and second lead layers are for the purpose of conducting the aforementioned sense current through the sensor parallel to the ABS and parallel to the major thin film surfaces of the layers of the sensor. The first and second hard bias layers longitudinally stabilize the magnetic moment of the free layer of the sensor in a single domain state. This is important for proper operation of the sensor. It is also important that the first and second hard bias layers be of the same size which is referred to in the art as being symmetrical. If the asymmetry between the first and second hard bias layers is significant, such as one of the hard bias layers being 40% thinner than the other hard bias layer, there may be an insufficient magnetic field between the first and second hard bias layers to longitudinally stabilize the free layer. This problem is prevalent in present methods of forming the junctions between sensors and hard bias layers.

Rows and columns of magnetic head assemblies, wherein each magnetic head assembly includes a read head and a write head, are fabricated on a wafer substrate in a sputtering chamber. Each magnetic head assembly is located on a respective slider wherein each slider is a portion of the wafer substrate. After completing the magnetic head assemblies the wafer substrate is diced into rows of sliders and each row of sliders is then lapped to form the aforementioned ABS. Each row is then diced into individual sliders wherein each slider has a magnetic head assembly with sensitive elements of the assembly exposed at the ABS.

The read sensors of the read head and the hard bias and lead layers are fabricated on the wafer substrate within the aforementioned sputtering chamber. The rows and columns of sliders, where the sensor and hard bias and lead layers are to be constructed, are typically located within a square or rectangle on the wafer substrate. The wafer substrate itself is typically circular. The preferred sputtering system employs a target of the material to be sputtered and an ion beam gun which directs an ion beam onto the target. This then causes atoms to be sputtered from the target and deposited on the wafer substrate. Before sputtering the atoms of the desired material, however, the sensor material layers including the pinned, spacer and free layers are deposited over the entire wafer substrate. A bilayer photoresist mask is then formed at each magnetic head assembly site for defining the side surfaces of each sensor. While the substrate is rotated ion milling is employed for removing all of the sensor material layers except sensor material layer portions which are masked by the photoresist masks wherein each mask may be a bilayer mask or a single mask. The sensor material layer portion below each bilayer photoresist constitutes a read sensor with first and second side surfaces which may be sloping. The next step is to connect the hard bias and lead layers to the first and second side surfaces of each sensor.

With the photoresist masks still in place a target of hard bias material is then bombarded with an ion beam from the ion beam gun causing hard bias atoms to be deposited on the wafer except where the photoresist masks are located. A seed layer is typically formed before the hard bias material is formed. During this process the wafer substrate is rotated. Unfortunately, in prior art sputtering schemes, the photoresist masks near the outer periphery of the wafer substrate cause a shadowing of the deposition at the outer extremities of the photoresist masks. Even though the wafer substrate is rotated during deposition, the hard bias layers are deposited to a desired thickness at the side surfaces of the sensor in a central location of the wafer while the hard bias layers at outer side surfaces of the sensors at outer extremities of the wafer are significantly thinner. This then causes the aforementioned improper biasing of the free layer which can render the read head inoperable for its intended purposes. This problem is not as acute for photoresist masks inwardly from the outer photoresist masks and is practically nonexistent for photoresist masks at a center location of the wafer substrate.

In the prior art, the target, which may be a hard bias or lead sputtering material layer, has a sputtering surface where atoms of the material are to be sputtered and the wafer substrate has a forming surface with a site where the sputtered layer is to be formed by the sputtering. The target has a sputtering center which is located at a center of the atoms to be sputtered from the target and the site has a periphery with a forming center which is located at the center of the periphery. In the prior art the sputtering center is opposite the forming center so that a center of a beam of atoms from the sputtering center hit the forming center of the site. This relationship is modified by the present invention.

SUMMARY OF THE INVENTION

In the present invention the sputtering center of the target is offset from the forming center of the wafer substrate. In a preferred embodiment the offset is at least one-half a distance from the forming center to an outside periphery defined by the rows and columns of sliders. Since the rows and columns of sliders are typically arranged in a square or a rectangle, the outside periphery location is considered to be at the corner of the squares or the farthest corners of the rectangle from the forming center. With this offset there is significantly less shadowing by the photoresist masks located near the periphery of the rows and columns of sliders. With the invention unacceptable asymmetries of the hard bias layers can be reduced more than 50%.

An object of the present invention is to improve the asymmetry of first and second hard bias layers that abut first and second side surfaces of a read sensor.

Another object is to improve the asymmetry of first and second layers deposited on a substrate wherein photoresists mask third layers which are located between the first and second deposited layers.

Other objects and attendant advantages of the invention will be appreciated upon reading the following description taken together with the accompanying drawings.

DESCRIPTION OF THE PREFERRED EMBODIMENTS

Magnetic Disk Drive

Figure 1:
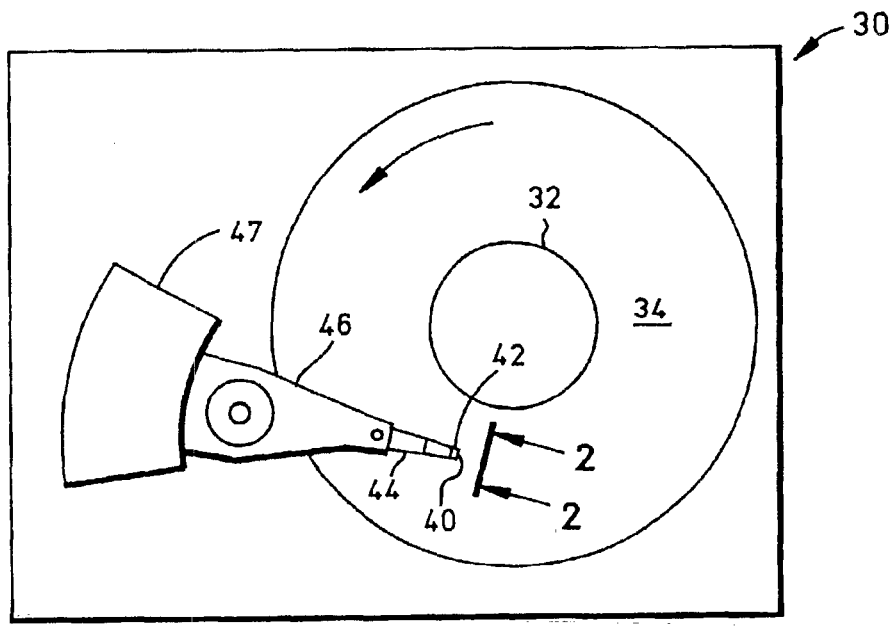
FIG. 1 is a plan view of an exemplary prior art magnetic disk drive.
Figure 2:
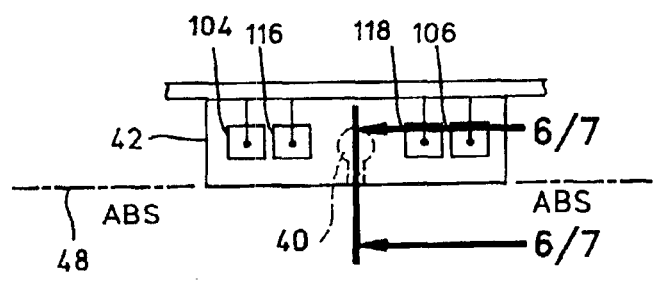
FIG. 2 is an end view of a slider with a magnetic head of the disk drive as seen in plane 2—2 of FIG. 1.
Figure 3:
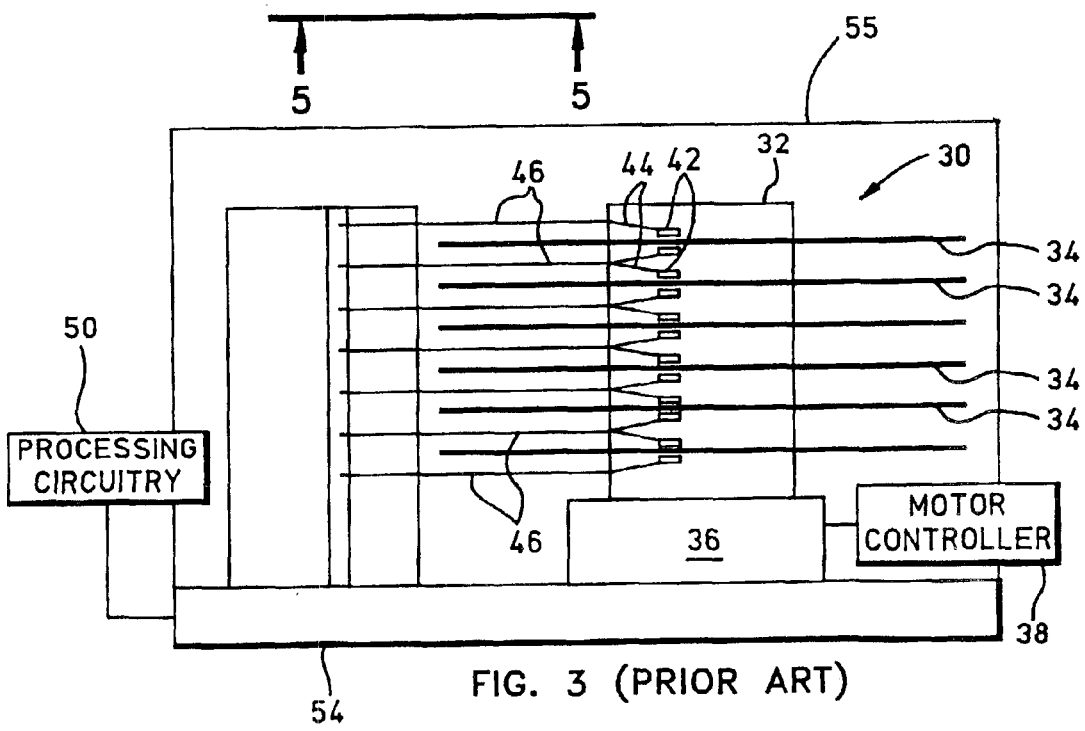
FIG. 3 is an elevation view of the magnetic disk drive wherein multiple disks and magnetic heads are employed.
Figure 4:
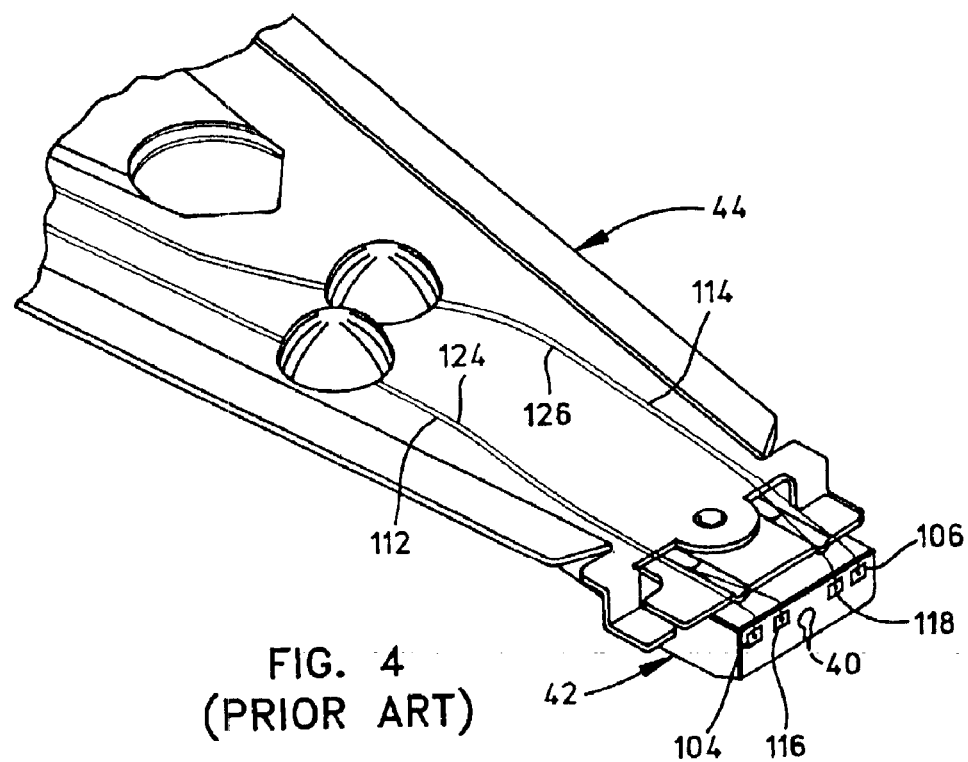
FIG. 4 is an isometric illustration of an exemplary prior art suspension system for supporting the slider and magnetic head.

Referring now to the drawings wherein like reference numerals designate like or similar parts throughout the several views, FIGS. 1–3 illustrate a magnetic disk drive 30. The drive 30 includes a spindle 32 that supports and rotates a magnetic disk 34. The spindle 32 is rotated by a spindle motor 36 that is controlled by a motor controller 38. A slider 42 has a combined read and write magnetic head 40 and is supported by a suspension 44 and actuator arm 46 that is rotatably positioned by an actuator 47. A plurality of disks, sliders and suspensions may be employed in a large capacity direct access storage device (DASD) as shown in FIG. 3. The suspension 44 and actuator arm 46 are moved by the actuator 47 to position the slider 42 so that the magnetic head 40 is in a transducing relationship with a surface of the magnetic disk 34. When the disk 34 is rotated by the spindle motor 36 the slider is supported on a thin (typically, 0.01 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides spindle motor drive signals for rotating the magnetic disk 34, and provides control signals to the actuator for moving the slider to various tracks. In FIG. 4 the slider 42 is shown mounted to a suspension 44. The components described hereinabove may be mounted on a frame 54 of a housing 55, as shown in FIG. 3.

Figure 5:
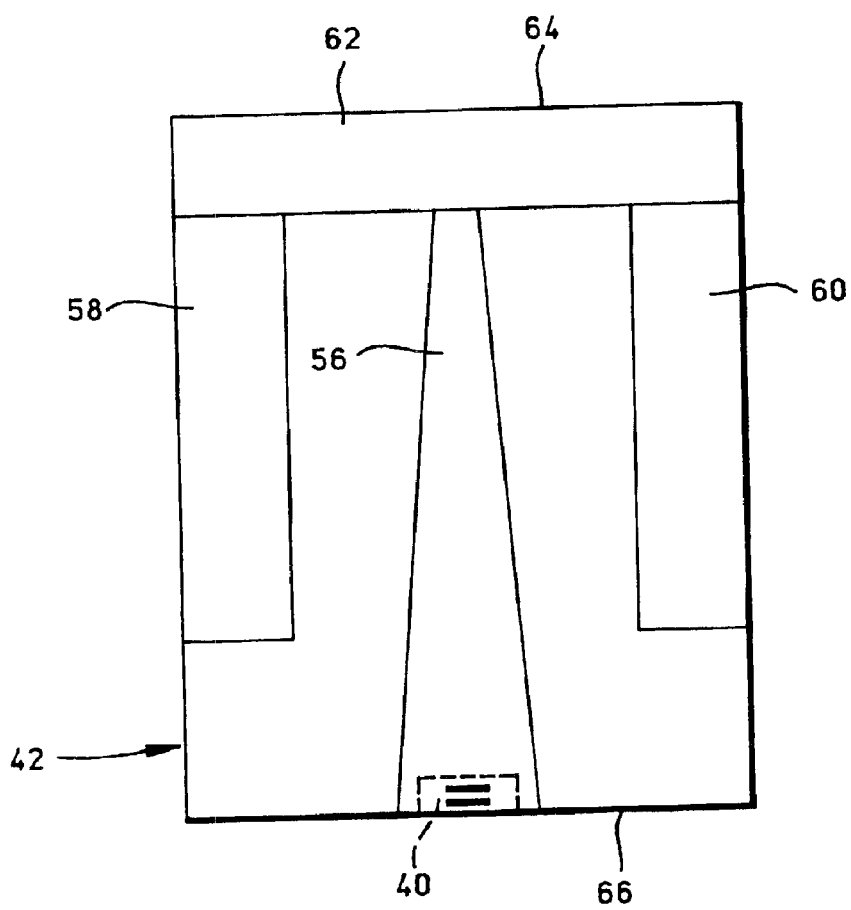
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Figure 6:
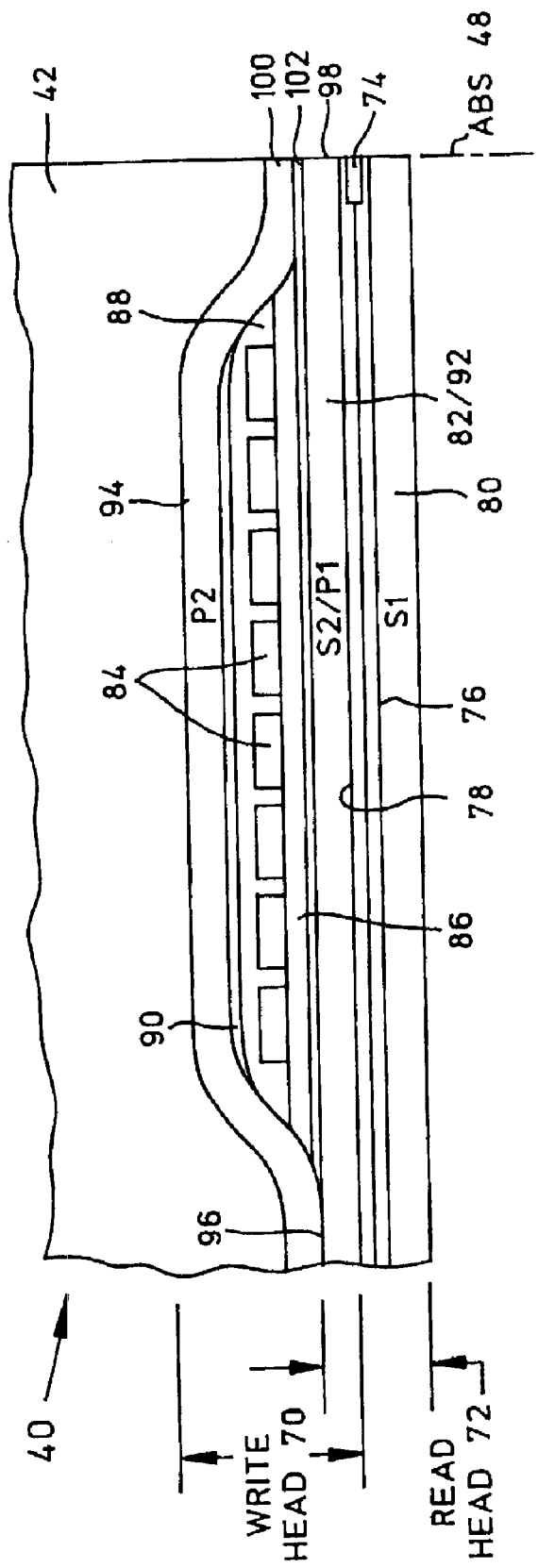
FIG. 6 is a partial view of the slider and a merged magnetic head as seen in plane 6—6 of FIG. 2.
Figure 7:
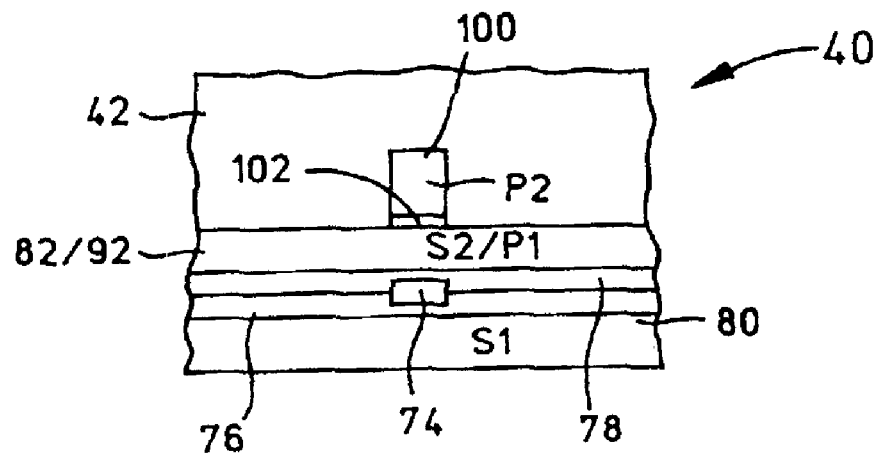
FIG. 7 is a partial ABS view of the slider taken along plane 7—7 of FIG. 6 to show the read and write elements of the magnetic head.

FIG. 6 is a side cross-sectional elevation view of a merged magnetic head 40, which includes a write head portion 70 and a read head portion 72, the read head portion employing a spin valve sensor 74 of the present invention. FIG. 7 is an ABS view of FIG. 6. The spin valve sensor 74 is sandwiched between nonmagnetic electrically insulative first and second read gap layers 76 and 78, and the read gap layers are sandwiched between ferromagnetic first and second shield layers 80 and 82. In response to external magnetic fields, the resistance of the spin valve sensor 74 changes. A sense current $I_S$ conducted through the sensor causes these resistance changes to be manifested as potential changes. These potential changes are then processed as readback signals by the processing circuitry 50 shown in FIG. 3.

Figure 8:
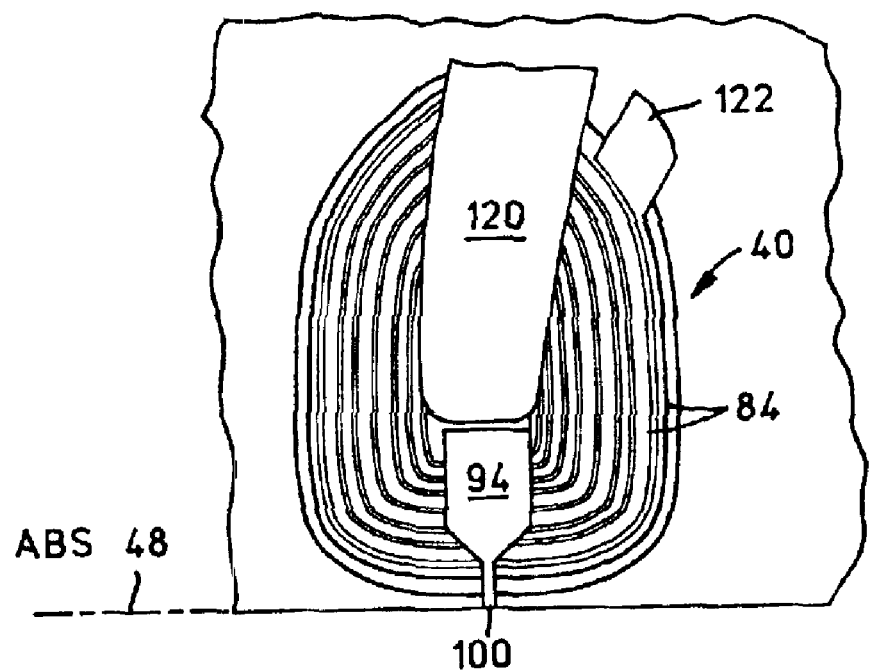
FIG. 8 is a view taken along plane 8—8 of FIG. 6 with all material above the coil layer and leads removed.

The write head portion 70 of the magnetic head 40 includes a coil layer 84 which is sandwiched between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are sandwiched between first and second pole piece layers 92 and 94. The first and second pole piece layers 92 and 94 are magnetically coupled at a back gap 96 and have first and second pole tips 98 and 100 which are separated by a write gap layer 102 at the ABS. Since the second shield layer 82 and the first pole piece layer 92 are a common layer this head is known as a merged head. In a piggyback head (not shown) the layers 82 and 92 are separate layers and are separated by an insulation layer. As shown in FIGS. 2 and 4, first and second solder connections 104 and 106 connect leads from the spin valve sensor 74 to leads 112 and 114 on the suspension 44, and third and fourth solder connections 116 and 118 connect leads 120 and 122 from the coil 84 (see FIG. 8) to leads 124 and 126 on the suspension.

Figure 9:
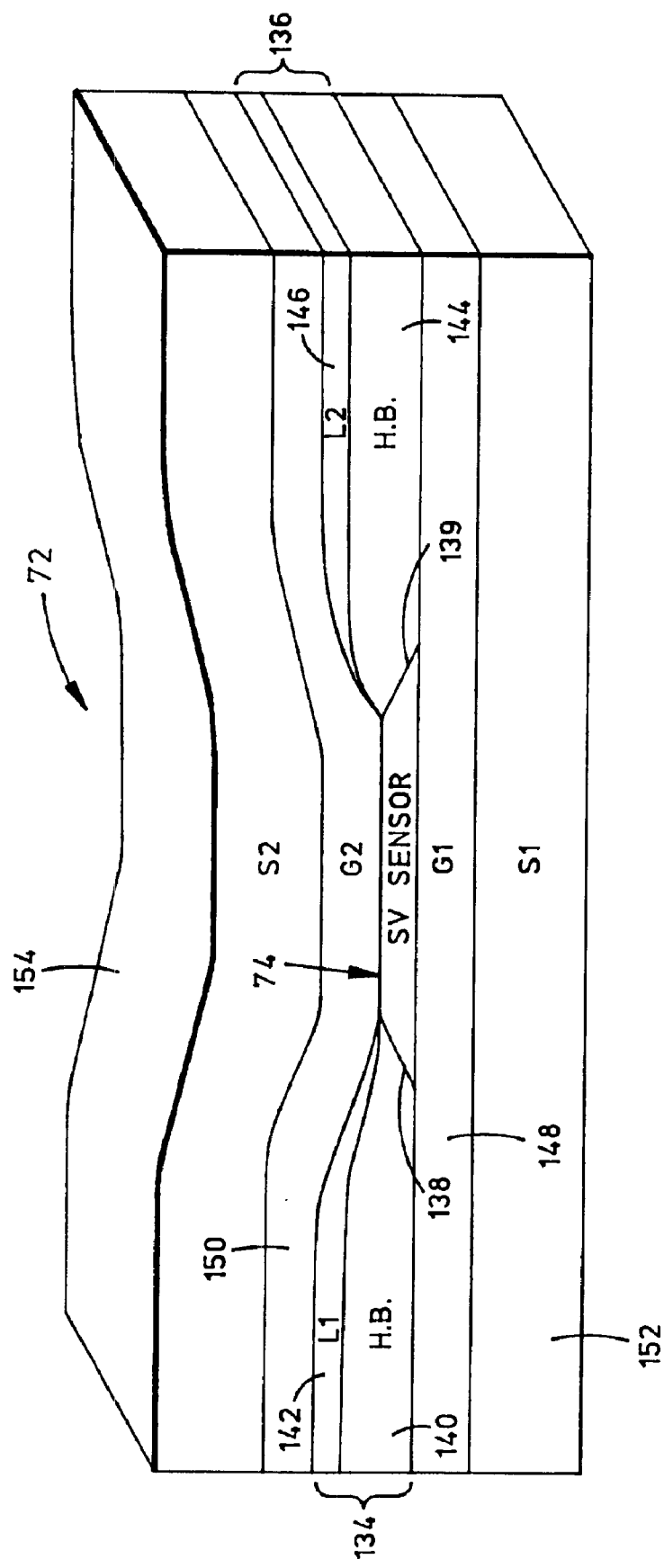
FIG. 9 is an enlarged isometric ABS illustration of a prior art read head which has a spin valve sensor.

FIG. 9 is an isometric ABS illustration of the read head 72 shown in FIG. 6. The read head 72 includes the spin valve sensor 74. First and second hard bias and lead layers 134 and 136 are connected to first and second side edges 138 and 139 of the spin valve sensor. The first hard bias and lead layers 134 include a first hard bias layer (H.B.) 140 and a first lead layer (L1) 142 and the second hard bias and lead layers 136 include a second hard bias layer (H.B.) 144 and a second lead layer (L2) 146. The hard bias layers 140 and 144 cause magnetic fields to extend longitudinally through the spin valve sensor 74 for stabilizing the magnetic domains therein. The spin valve sensor 74 and the first and second hard bias and lead layers 134 and 136 are located between the nonmagnetic electrically insulative first and second read gap layers 76 and 78 and the first and second read gap layers 76 and 78 are, in turn, located between the ferromagnetic first and second shield layers 80 and 82.

The first and second hard bias layers 140 and 144 and the first and second lead layers 142 and 146 illustrate such layers fabricated by a prior art ion beam sputtering system. In such a system the hard bias and lead layers fabricated near an outer periphery of the site being sputtered on the wafer substrate results in the first hard bias layer 140 and the first lead layer 142 being thinner than the second hard bias layer 144 and the second lead layer 146 respectively which problem will be discussed in detail hereinbelow.

Figure 10:
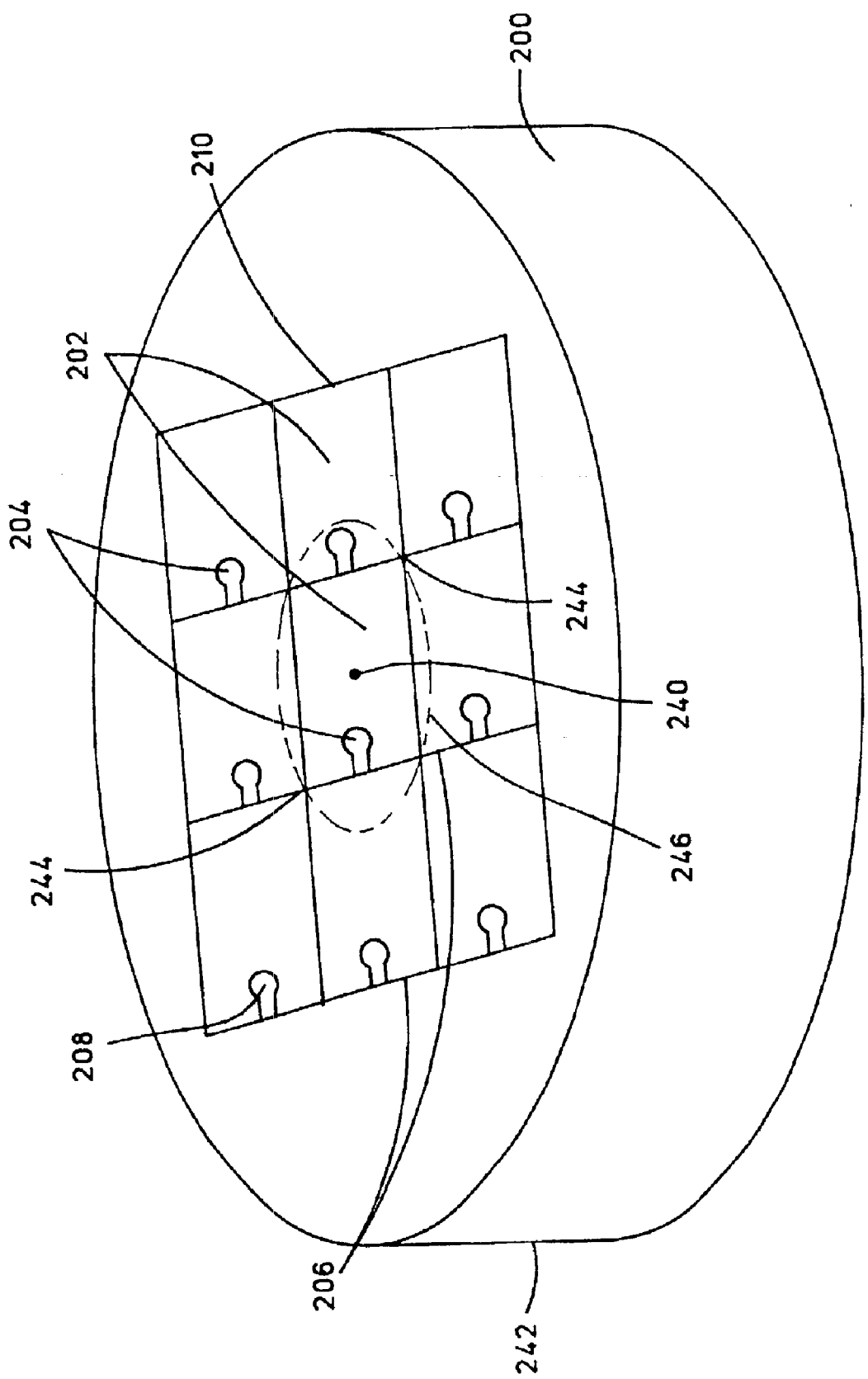
FIG. 10 is an isometric illustration of a wafer substrate with rows and columns of sliders wherein each slider has a magnetic head assembly.

FIG. 10 illustrates a wafer substrate 200 which has rows and columns of sliders 202 wherein each slider has a magnetic head assembly 204. After fabricating the magnetic head assemblies 204 the rows and columns of magnetic head assemblies are diced into rows of magnetic head assemblies along edges 206. Each row of sliders is then lapped at an edge 206 to form the aforementioned ABS and then the row is diced into individual sliders for mounting in a magnetic disk drive, such as that illustrated in FIG. 3.

Figure 11A:
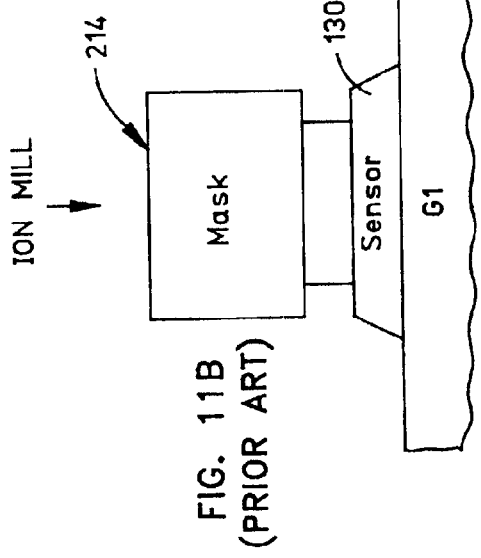
FIGS. 11A–11D are side views of various prior art steps in fabricating a sensor and first and second hard bias layers and first and second lead layers abutting first and second side surfaces of a sensor.
Figure 11B:
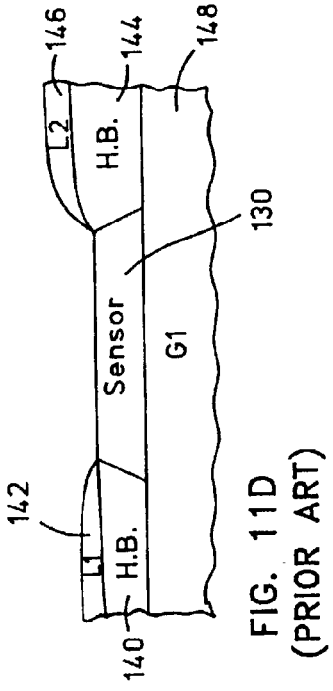
Figure 11C:
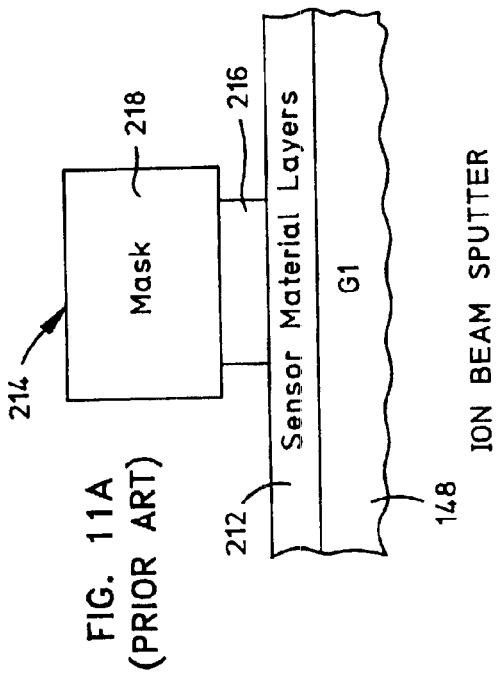
Figure 11D:
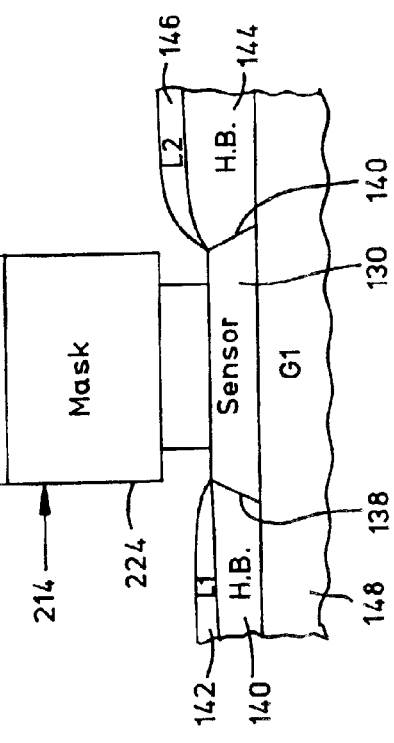

FIGS. 11A–11D illustrate a prior art scheme of constructing the aforementioned sensor 130, the first and second hard bias layers 140 and 144 and the first and second lead layers 142 and 146. These figures illustrate the fabrication of such layers of a magnetic head assembly 208 which is located at the corner of a periphery 210 about a site where atoms are sputtered in an ion beam sputtering chamber, which will be discussed in more detail hereinafter. In FIG. 11A a sensor material layer 212 is deposited on the first read gap layer 148 on the wafer substrate 200 in FIG. 10 wherein the sensor material layer includes the aforementioned multiple layers of a sensor. A photoresist mask, such as bilayer photoresist mask 214, is located on the sensor material layers 212 and has first and second layers 216 and 218 wherein the bottom layer 216 has an undercut below each side of the top layer 218. This bilayer photoresist mask is well-known in the prior art. In FIG. 11B ion milling is implemented while the wafer substrate 200 in FIG. 10 is rotated. This causes removal of the sensor material layer except for a sensor material layer portion below the bilayer photoresist 214, which portion constitutes the sensor 130. In FIG. 11C atoms are ion beam sputtered from a target (not shown) to form the first and second hard bias layers 140 and 144 and first and second lead layers 142 and 146 which abut the first and second side surfaces 138 and 140 of the sensor. Hard bias (H.B.) material 220 and lead (L) material 222 are also deposited on top of the bilayer photoresist mask 214. In FIG. 11D the bilayer photoresist mask 214 is removed leaving a first hard bias layer 140 and a lead layer 142 which are thinner than the second hard bias layer 144 and the second lead layer 146. This is because the first hard bias layer 140 and the first lead layer 142 were located on an outer extremity 224 of the bilayer photoresist mask 214, as seen in FIG. 11C, where the bilayer photoresist mask 214 causes shadowing of the sputtered atom, which will be explained hereinbelow.

Figure 12A:
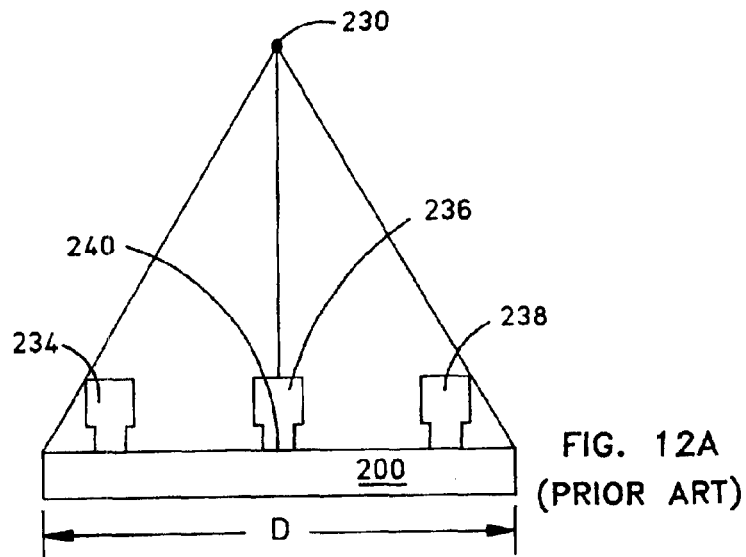
FIG. 12A is a schematic prior art illustration of sputtered flux emanating from a sputtering center of a target (not shown) to various locations on a wafer substrate which is masked by a plurality of bilayer photoresist masks.
Figure 12B:
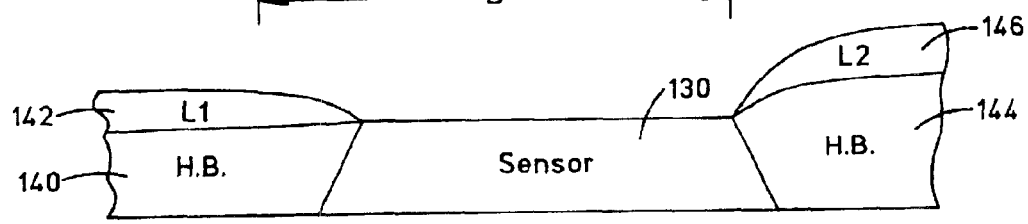
FIG. 12B is a side view of first and second hard bias (H.B.) layers and first and second lead layers (L1) and (L2) fabricated by the prior art scheme shown in FIG. 12A.

FIG. 12A is a schematic illustration of a portion of the prior art ion beam sputtering system wherein atoms are being sputtered from a center of sputtering 230 toward the wafer substrate 200 wherein first, second and third bilayer photoresist masks 234, 236 and 238 are located. The bilayer photoresist mask 236 is aligned with a site center 240 of the site being sputtered on the wafer substrate wherein the site center is at a center of the periphery of such site. This site is typically the rows and columns of sliders 202 shown in FIG. 10 and has a lesser periphery than an outer periphery 242 of the wafer substrate 200. The wafer substrate 200 in FIG. 12A is rotated during the sputtering. It can be seen that the bilayer photoresists 234 and 238 cause a shadowing of the sputtered atoms from the sputtering center 230 at their outer peripheries. The shadowing of the sputtered atoms at the inner extremities of the bilayer photoresist 234 and 238 is minimal. Accordingly, the first hard bias layer 140 and the first lead layer 142 fabricated by the sputtered atoms adjacent the outer periphery of either bilayer photoresist 234 or 238 will have thicknesses that are less than the hard bias layer 144 and the lead layer 146 fabricated adjacent the inner extremity of either of the bilayer photoresists 234 and 238.

The Invention

Figure 13A:
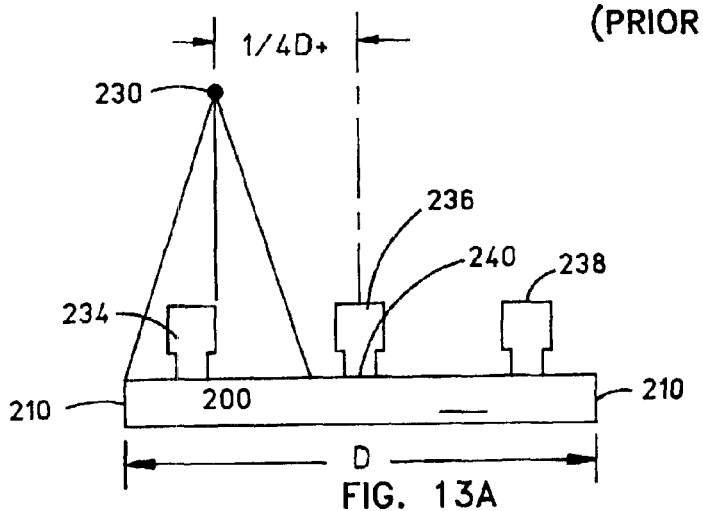
FIG. 13A is the same as FIG. 12A except the sputtering center of the target has been offset from a forming center on the wafer substrate, which forming center is located below the middle photoresist mask.
Figure 13B:
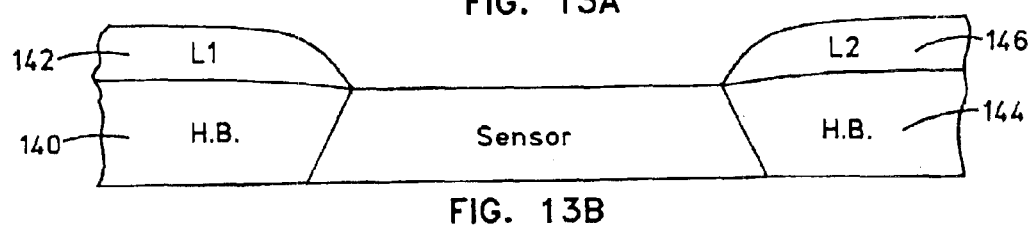
FIG. 13B is the same as FIG. 12B except the first and second hard bias layers (H.B.) and first and second lead layers (L1) and (L2) are symmetrical when fabricated by the scheme shown in FIG. 13A.

In the present invention the sputtering center 230 is offset from the site center 240 by a distance preferably at least ¼ D which is shown by an offset greater than ¼ D in FIG. 13A wherein D is the width of the sputtered site on the wafer substrate. The site center 240 is centered within the periphery 210 of the sputtering site as seen in FIG. 10. It can now be seen that the shadowing of the sputtered atoms at the outer extremity of the bilayer photoresist mask 234 in FIG. 13A is significantly less than the shadowing of the sputtered atoms at the outer extremity of the bilayer photoresist 234 in FIG. 12A. Since the wafer substrate 200 is rotated during sputtering the bilayer photoresist 238 in FIG. 13A will be located under the sputtering center 230 when the rotation is 180°. The result is shown in FIG. 13B wherein the first and second hard bias layers 140 and 144 are symmetrical and the first and second lead layers 142 and 146 are symmetrical. It should be noted that in the prior art sputtering system shown in FIG. 12A that the hard bias and lead layers fabricated adjacent the bilayer photoresist 236 will also be symmetrical, as shown in FIG. 13B. It should further be noted that if the sputtering center 230 is offset ¼ D that the sputtering center 230 will be located at centers 244 of each quadrant of magnetic head assemblies as the wafer substrate 200 in FIG. 10 is rotated. Further, the sputtering center 230 in FIG. 13A will follow a track 244 on the wafer substrate in FIG. 10 as the wafer substrate is rotated during sputtering.

Figure 14:
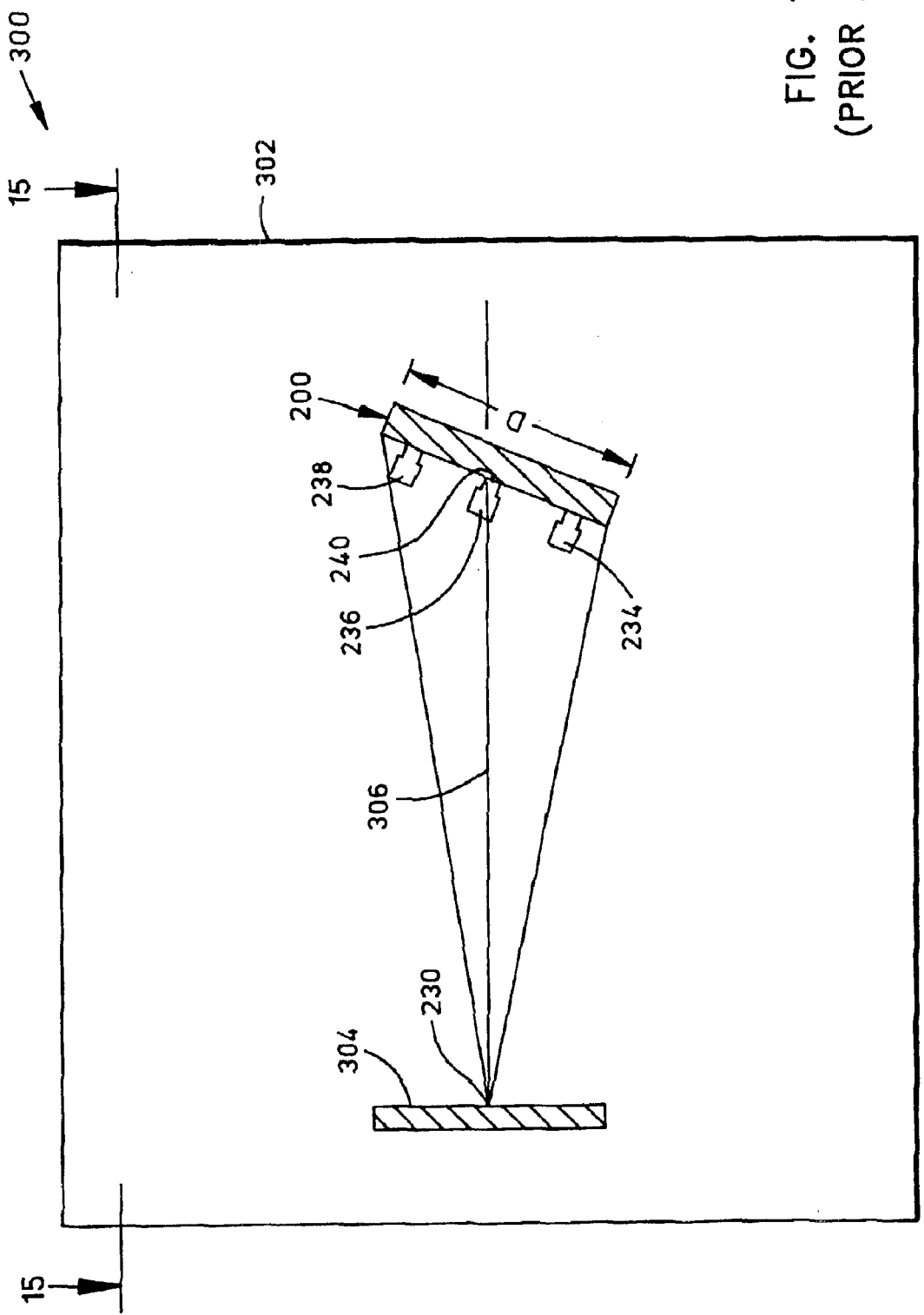
FIG. 14 is a schematic cross-section illustration of a prior art ion beam sputtering system.
Figure 15:
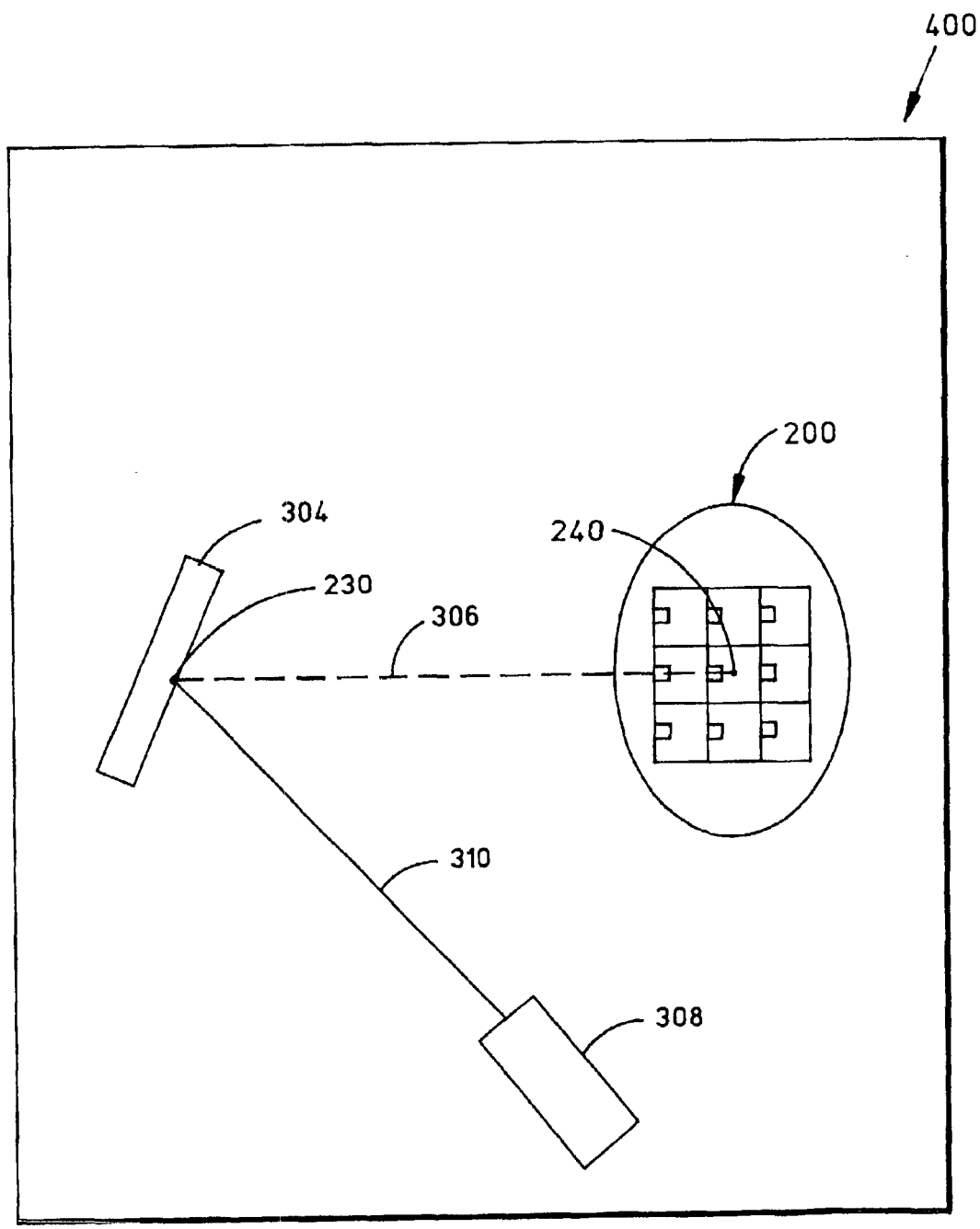
FIG. 15 is a view taken along plane 15—15 of FIG. 14.

FIG. 14 is a schematic illustration of a prior art ion beam sputtering system 300 which has an ion beam sputtering chamber 302. Within the chamber 302 is a target 304 of the material to be sputtered, such as hard bias material or lead layer material, and the wafer substrate 200 with the bilayer photoresists 234, 236 and 238. In the sputtering chamber the sputtered surface of the target 304 and the forming surface of the wafer substrate 200 are tilted at an angle with respect to one another. The tilting of the substrate or the stage is fully described in commonly assigned U.S. Pat. No. 6,086,727 which is incorporated by reference herein. In spite of this angle, it can be seen that the bilayer photoresists 234 and 238 cause a shadowing of the sputtered atoms from the sputtering center 230 at the outer extremities of the bilayer photoresists 234 and 238. Hypothetically, if the sputtering system 300 in FIG. 14 was turned with the sputtering center 230 directly above the site center 240 and an atom fell by gravity from the sputtering center it would fall along path 306 and strike the site center 240 which path is a central axis of the sputtering. FIG. 15 is an isometric view of FIG. 14 taken along line 15—15. This figure shows an ion beam gun 308 which directs an ion beam with a central axis 310 on the sputtering center 230 of the target which, in turn, causes sputtered atoms to travel along the path 306 and strike the wafer substrate at site center 240.

Figure 16:
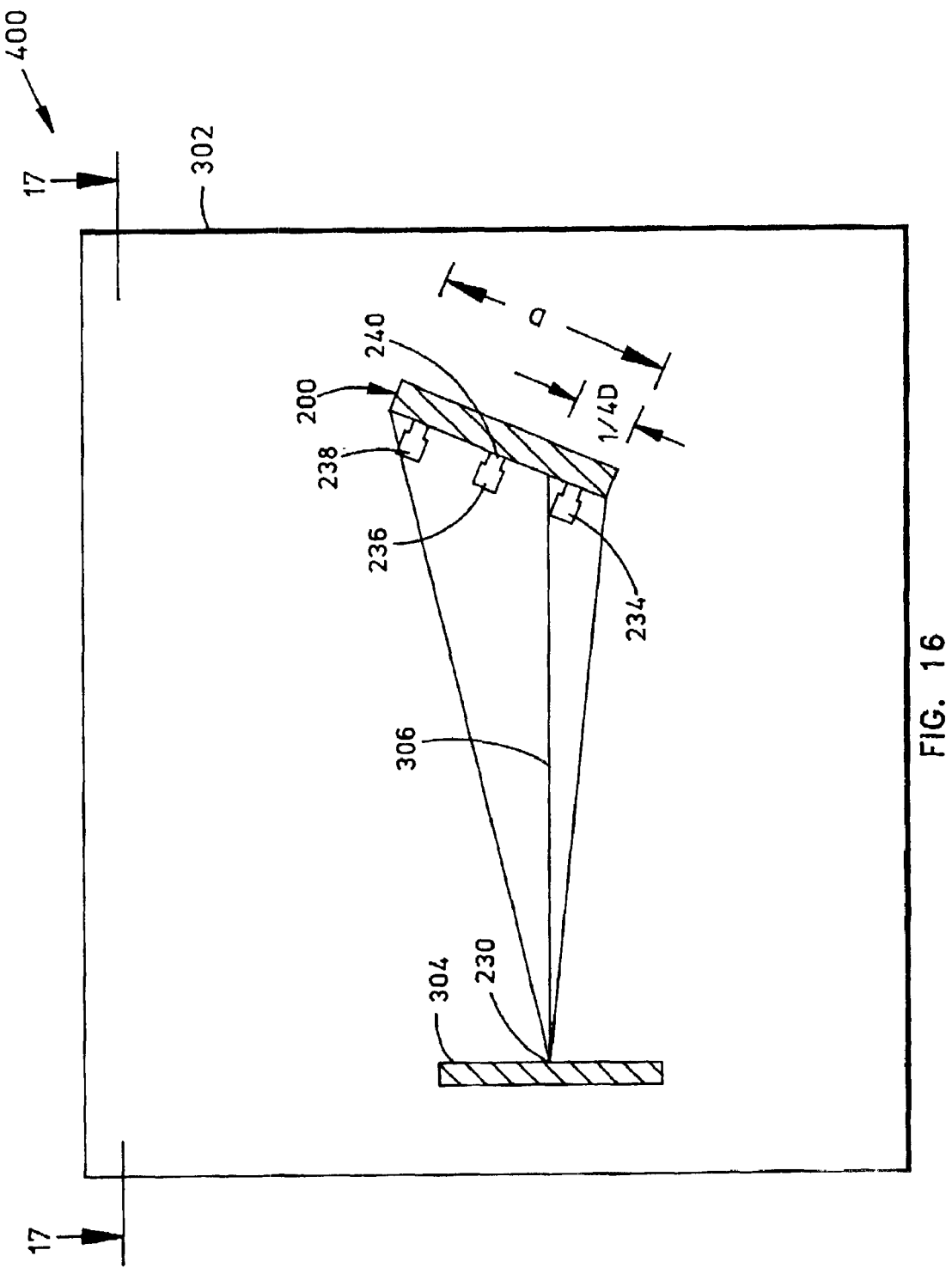
FIG. 16 is a schematic cross-section illustration of the present ion beam sputtering system.
Figure 17:
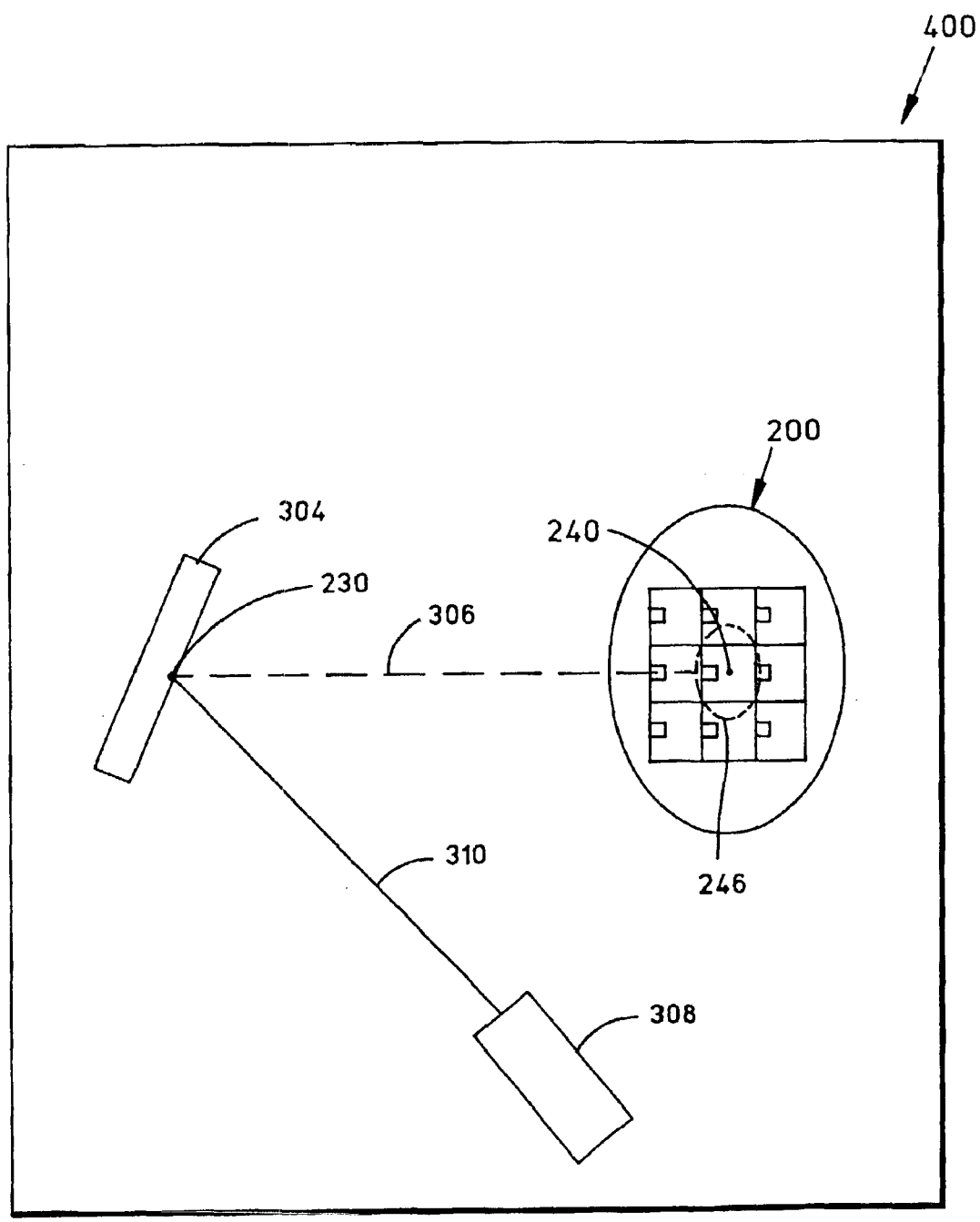
FIG. 17 is a view taken along plane 17—17 of FIG. 16.

In the present sputtering system 400 in FIGS. 16 and 17 the sputtering center 230 is offset by a distance ¼ D from the site center 240 wherein D is the distance across the site being sputtered on the wafer substrate. It can be seen that there is less shadowing of the sputtered atoms at the outer extremities of the bilayer photoresist masks 234 and 238 as compared to the shadowing at the outer extremities of the bilayer photoresist masks 234 and 238 in FIG. 14. It can be seen from FIG. 17 that the sputtering center 230 is offset from the site center 240 and will follow along a track 246 as the wafer substrate 200 is rotated. The result is that the hard bias layers will be more symmetrical with the system 400 shown in FIG. 15 than with the system 300 shown in FIG. 14.

In each of the systems shown in FIGS. 14 and 16, a cross-section is taken through each of the target 304 and the wafer substrate 200. In reality, the target 304 in each of the systems partially faces the observer of FIGS. 14 and 16.

Figure 18:
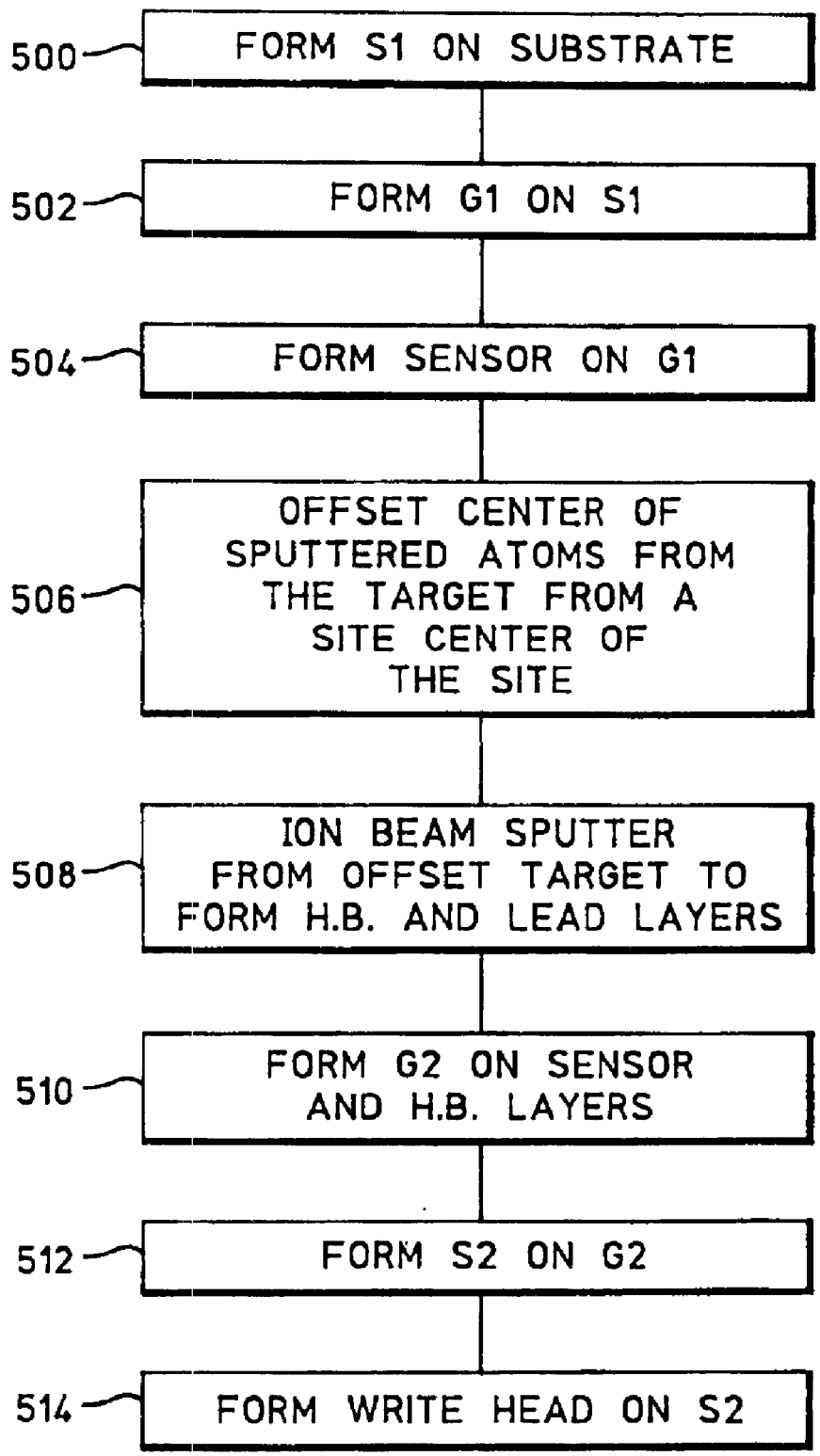
FIG. 18 is a block diagram illustrating a first embodiment of the method of the present invention.

FIG. 18 illustrates in block diagram the formation of a magnetic head assembly employing the present invention. In block 500 a first shield layer (S1) is formed on a substrate, such as first shield layer 152 in FIG. 9 being formed on the substrate 200 in FIG. 10, In block 502 the first read gap layer (G1), such as the first read gap layer 148 in FIG. 9, is formed on the first shield layer. In block 504 the sensor 130 in FIG. 9 is formed on the first read gap layer. In block 506 the center of sputtered atoms from the target, such as the center of the sputtered atoms 230 of the target 304 in FIG. 16, is offset from the site center 240 of the site. In block 508 the ion beam gun 308 in FIG. 17 is employed for ion beam sputtering from the offset target 304 to form the symmetrical hard bias (H.B.) and lead layers 140 and 144 as shown in FIG. 13B. In block 510 the second read gap layer (G2) 150 in FIG. 9 is formed on the sensor and the hard bias and lead layers and in block 512 the second shield layer (S2) 154 is formed on the second read gap layer. Finally, the write head 70, shown in FIG. 6, is formed on the second shield layer, as shown in block 514.

Figure 19:
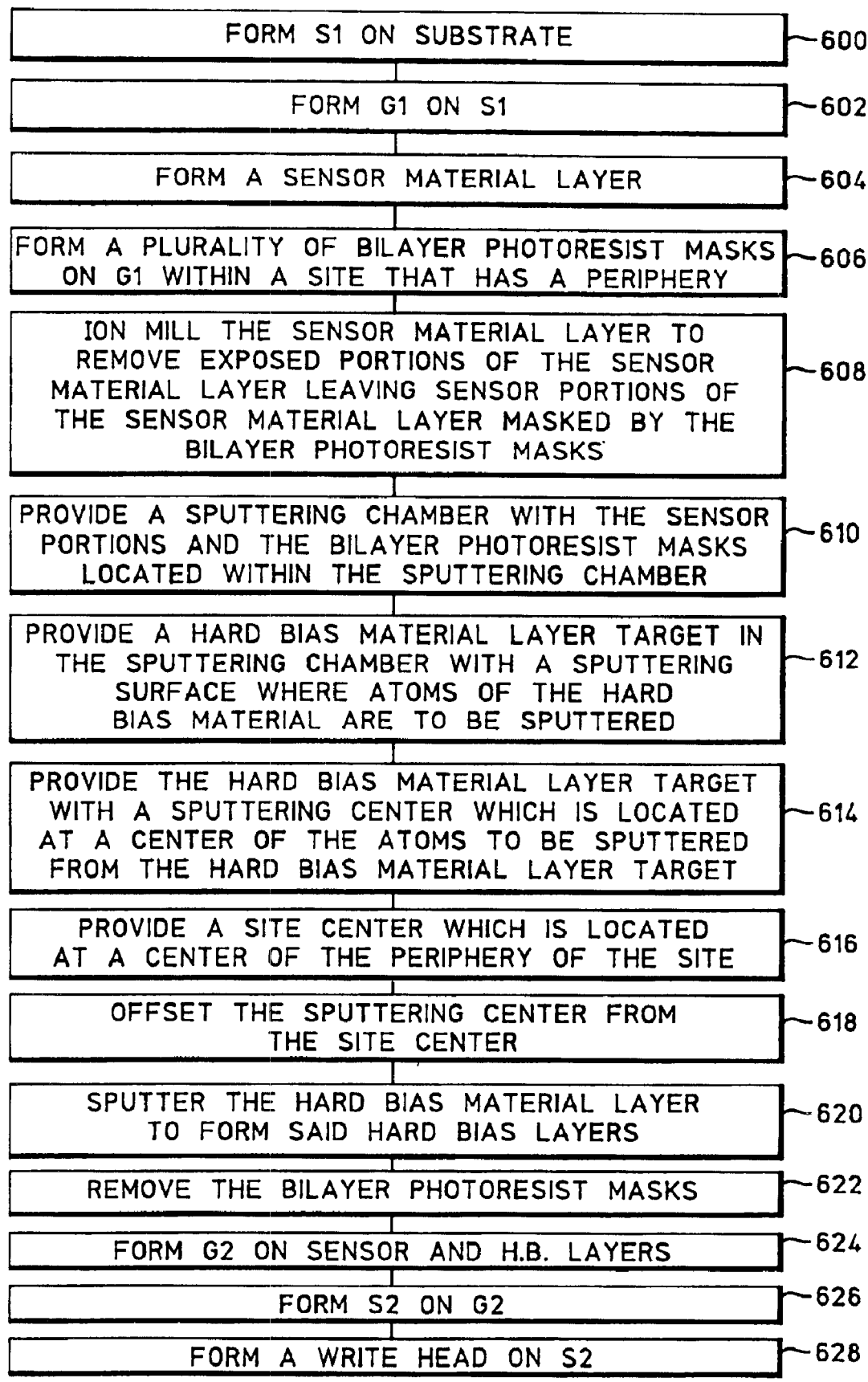
FIG. 19 is a block diagram of another embodiment of a method of the present invention.

A more detailed method of making the magnetic head assembly is illustrated in FIG. 19 wherein blocks 600 and 602 are the same as blocks 500 and 502 in FIG. 18. In block 604 a sensor material layer 212, as shown in FIG. 11A, is formed on the first read gap layer 148. In block 606 a plurality of bilayer photoresist masks are formed on the first read gap layer (G1) within a site that has a periphery. In block 608 the sensor material layer is ion milled to remove portions of the sensor material layer not masked by the bilayer photoresist masks shown in FIG. 11B. In block 610 a sputtering chamber is provided with the sensor portions and the bilayer photoresist masks located therein. In block 612 a hard bias material layer target is provided in the sputtering chamber with a sputtering surface where hard bias material is to be sputtered from the hard bias material layer. In block 614 a hard bias material layer is provided with a sputtering center which is located at a center of sputtered atoms from the target as defined by a center of an ion beam from an ion beam gun. In block 616 a site center is provided at a center of the aforementioned site. In block 618 the sputtering center 230 is offset from the site center 240, as shown in FIG. 16, instead of being directly opposite thereof, as shown in FIG. 14. In block 620 a hard bias material layer target is sputtered to form the hard bias layers 140 and 144, as shown in FIG. 13B. In block 622 the bilayer photoresist layers are removed, as shown in FIG. 11D. In block 624 the second read gap layer 150 in FIG. 9 is formed on the sensor and the hard bias layers, as well as the lead layers 142 and 146, which steps have been omitted from FIG. 19. In block 626 the second shield layer (S2) 154 is formed on the sensor, hard bias and lead layers and the second read gap layer and in block 628 the write head 70 in FIG. 6 is formed on the second shield layer.

Discussion

It should be understood that the invention may be practiced with sputtering systems other than an ion beam sputtering system. For instance, in a conventional sputtering system where hard bias material is sputtered from a small target to the sputtered site on the substrate the shadowing can be minimized for outwardly located hard bias layers in the site when the pressure of the sputtering system is relatively low so that collision between sputtered atoms is minimized. An example would be an 8 inch wide sputtered site on the substrate and a 5 inch wide sputtered site and a target with a width of 3 inches.

Tests run with the present invention show that the improvement of acceptable hard bias and leads on various wafers is improved by about 50% with the present invention, as shown in the following chart.

|  | Prior Art HB/Leads | With improved HB/Leads |
| --- | --- | --- |
| # of wafers | 6 | 3 |
| Amplitude | 886 | 876 |
| Asymmetry Standard Deviation | 17.6 | 15.83 |
| Asymmetry Range | 48.48 | 34.51 |
| Unacceptable Heads | 14.7% | 7.36% |

As shown in the second column, 6 wafers with multiple magnetic head assemblies were tested which resulted in the read heads having a read amplitude of 886 microvolts, an asymmetry standard deviation of 17.6, an asymmetry range of 48.48 and a percentage of unacceptable heads on the wafers being 14.7%. In the third column, 3 wafers were tested wherein the amplitude of the read heads were 876 microvolts, the asymmetry standard deviation was 15.83, the asymmetry range was 34.51 and the percentage of unacceptable heads was 7.36%.

Clearly, other embodiments and modifications of this invention will occur readily to those of ordinary skill in the art in view of these teachings. Therefore, this invention is to be limited only by the following claims, which include all such embodiments and modifications when viewed in conjunction with the above specification and accompanying drawings.

We claim:

1. A sputtering system comprising:
    a sputtering chamber, a substrate and a sputtering material layer that is to be sputtered wherein the substrate and the sputtering material layer are located within the sputtering chamber;
    the sputtering material layer having a sputtering surface where atoms of the sputtering material are to be sputtered and the substrate having a forming surface with a site where a sputtered layer is to be formed by said sputtering;
    the sputtering material layer having a sputtering center which is located at a center of atoms to be sputtered from the sputtering material layer;
    an ion beam gun located within the sputtering chamber and positioned therein to direct a center of an ion beam at said sputtering center for causing sputtering from the sputtering material layer along a central axis which is centered within the sputtering;
    said site having a periphery with a site center located at a center of said periphery; and
    the central axis of the sputtering being offset from said site center wherein the offset extends within a plane which is parallel to the sputtering surface in a direction which is normal to a plane defined by the center of the ion beam at the ion beam gun and said central axis.

2. A sputtering system as claimed in claim 1 further comprising:
    a plurality of photoresist masks located on said site for masking selected portions of said site from said sputtering.

3. A sputtering system as claimed in claim 1 wherein the offset is at least one half a distance from the site center to said, periphery.

4. A sputtering system as claimed in claim 3 further comprising:
    a plurality of photoresist masks located on said site for masking selected portions of said site from said sputtering.

5. A method of sputtering comprising the steps of:
    providing a sputtering chamber, a substrate and a sputtering material layer that is to be sputtered with the substrate and the sputtering material layer located within the sputtering chamber;
    providing the sputtering material layer with a sputtering surface where atoms of the sputtering material are to be sputtered and the substrate with a forming surface with a site where a sputtered layer is to be formed by said sputtering;
    providing the sputtering material layer with a sputtering center which is located at a center of atoms to be sputtered from the sputtering material layer;
    providing an ion beam gun within the sputtering chamber which is positioned therein to direct a center of an ion beam at said sputtering center for causing sputtering from the sputtering material layer along a central axis which is centered within the sputtering;
    providing the site with a periphery with a site center located at a center of said periphery; and
    offsetting the central axis of the sputtering from said site center wherein the offset extends within a plane which is parallel to the sputtering surface in a direction which is normal to a plane defined by the center of the ion beam at the ion beam gun and said central axis.

6. A method as claimed in claim 5 further comprising the step of:
    providing a plurality of photoresist masks on said site for masking selected portions of said site from said sputtering.

7. A method as claimed in claim 5 further comprising the step of directing an ion beam from the ion beam gun to cause the sputtering material layer to be sputtered.

8. A method as claimed in claim 5 wherein the central axis of the sputtering is offset from said site center by at least one-half distance from the site center to said periphery.

9. A method as claimed in claim 8 further comprising the step of directing an ion beam from the ion beam gun to cause the sputtering material layer to be sputtered.

10. A method as claimed in claim 9 further comprising the step of:
    providing a plurality of photoresist masks on said site for masking selected portions of said site from said sputtering.

11. A method of making a magnetic head assembly comprising the steps of:
    forming a ferromagnetic first shield layer on a substrate;
    forming a nonmagnetic electrically nonconductive first read gap layer on the first shield layer;
    forming a sensor material layer on the first read gap layer;
    forming a plurality of photoresist masks on the first read gap layer within a site which has a periphery;
    ion milling the sensor material layer to remove exposed portions of the sensor material layer leaving sensor portions of the sensor material layer masked by the photoresist masks;
    forming hard bias layers abutting side surfaces of the sensor portions including the steps of:
        providing a sputtering chamber with the sensor portions and the photoresist masks located within the sputtering chamber;
        providing a hard bias material layer in the sputtering chamber with a sputtering surface where atoms of the hard bias material layer are to be sputtered;
        further providing the hard bias material layer with a sputtering center which is located at a center of the atoms to be sputtered from the hard bias material layer;
        providing an ion beam gun within said sputtering chamber;
        directing a center of an ion beam from the ion beam gun on said sputtering center for causing sputtering from the sputtering material layer along a central axis which is centered within the sputtering;
        providing a site center which is located at a center of the periphery of said site;
        offsetting the central axis of the sputtering from said site center wherein the offset extends within a plane which is parallel to the sputtering surface in a direction which is normal to a plane defined by the center of the ion beam at the ion beam gun and said central axis;

sputtering the hard bias material layer to form said hard bias layers; and removing the photoresist masks;

forming a nonmagnetic electrically nonconductive second read gap layer on the sensor portions and the hard bias layer; and forming a ferromagnetic second shield layer on the second read gap layer.

12. A method as claimed in claim 11 further comprising the step of forming a write head on the second shield layer.

13. A method as claimed in claim 11 wherein the offset is at least one half a distance from the site center to said periphery.

14. A method as claimed in claim 13 further comprising the step of forming a write head on the second shield layer.

15. A sputtering system comprising:

a sputtering chamber;

a target of material to be sputtered, a substrate and an ion beam gun for directing an ion beam onto the target for causing said material to be sputtered from the target onto said substrate;

the substrate having a site within a forming surface where components are to be formed by the sputtered material;

the site having a periphery and a site center with the site center being centered within the periphery;

the target having a planar surface with a sputtering center;

upon directing the ion beam, the ion beam having a central axis which intersects the sputtering center so that sputtering from the target toward the site has a central axis which intersects the sputtering center at the target and a point on said site; and said point being offset from the site center in a plane which is parallel to the planar surface of the target in a direction which is normal to a plane defined by the central axes of the ion beam and the sputtering.

16. A sputtering system as claimed in claim 15 further comprising:

the substrate being capable of being rotated about a center of the substrate; and upon rotating the substrate, the central axis of the sputtering intersecting the site to define a track about said site center.

17. A sputtering system as claimed in claim 15 further comprising:

a plurality of photoresist masks located on said site for masking selected portions of said site from said sputtering.

18. A sputtering system as claimed in claim 15 wherein the offset is at least one half the distance from the site center to said periphery.

19. A sputtering system as claimed in claim 18 further comprising:

the substrate being capable of being rotated about a center of the substrate; and upon rotating the substrate, the central axis of the sputtering intersecting the site to define a track about said site center.

20. A sputtering system as claimed in claim 19 further comprising:

a plurality of photoresist masks located on said site for masking selected portions of said site from said sputtering.

21. A method of sputtering comprising the steps of:

providing a sputtering chamber;

providing a target of material to be sputtered, a substrate and an ion beam gun for directing an ion beam onto the target for causing said material to be sputtered from the target onto said substrate;

providing the substrate with a site within a forming surface where components are to be formed by the sputtered material;

providing the site with a periphery and a site center with the site center being centered within the periphery;

providing the target with a planar surface which has a sputtering center;

upon directing the ion beam, providing the ion beam with a central axis which intersects the sputtering center so that the sputtering from the target toward the site has a central axis which intersects the sputtering center at the target and a point on said site; and offsetting said point from the site center in a plane which is parallel to the planar surface of the target in a direction which is normal to a plane defined by the central axes of the ion beam and the sputtering.

22. A method as claimed in claim 21 further comprising the step of:

rotating the substrate about a center of the substrate so that the central axis of the sputtering intersects the site to define a track about said site center.

23. A method as claimed in claim 21 further comprising:

locating a plurality of photoresist masks on said site for masking selected portions of said site from said sputtering.

24. A method as claimed in claim 21 wherein the offsetting is at least one half the distance from the site center to said periphery.

25. A method as claimed in claim 24 further comprising the step of:

rotating the substrate about a center of the substrate so that the central axis of the sputtering intersects the site to define a track about said site center.

26. A method as claimed in claim 25 further comprising:

locating a plurality of photoresist masks on said site for masking selected portions of said site from said sputtering.

* * * * *